(12) United States Patent      (10) Patent No.: US 7,786,511 B2
Ishida      (45) Date of Patent: Aug. 31, 2010

(54) SEMICONDUCTOR DEVICE WITH SCHOTTKY AND OHMIC ELECTRODES IN CONTACT WITH A HETEROJUNCTION

(75) Inventor: Hidetoshi Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/260,383

(22) Filed: Oct. 29, 2008

(65) Prior Publication Data

US 2009/0114948 A1     May 7, 2009

(30) Foreign Application Priority Data

Nov. 2, 2007    (JP)   ............................ 2007-286613

(51) Int. Cl.
*H01L 29/12*      (2006.01)
(52) U.S. Cl. .................. 257/201; 257/472; 257/624; 257/E29.144; 257/E29.149
(58) Field of Classification Search .............. 257/201, 257/472, 624, E29.148, E29.149, E29.143, 257/E29.144
See application file for complete search history.

(56) References Cited

U.S. PATENT DOCUMENTS

| | | | | |
|---|---|---|---|---|
| 2006/0065908 | A1* | 3/2006 | Beach | ................. 257/107 |
| 2006/0108659 | A1* | 5/2006 | Yanagihara et al. | ......... 257/471 |
| 2006/0175618 | A1 | 8/2006 | Ishida | |
| 2006/0197175 | A1 | 9/2006 | Yanagihara et al. | |
| 2006/0261371 | A1 | 11/2006 | Kuroda et al. | |
| 2007/0029633 | A1 | 2/2007 | Hirose et al. | |
| 2007/0051938 | A1* | 3/2007 | Otsuka et al. | ................. 257/14 |
| 2007/0057290 | A1 | 3/2007 | Ishida et al. | |
| 2007/0228401 | A1 | 10/2007 | Machida et al. | |
| 2007/0278521 | A1 | 12/2007 | Ishida et al. | |

FOREIGN PATENT DOCUMENTS

JP      2006-108676 A      4/2006

OTHER PUBLICATIONS

English language Abstract and translation JP 2006-108676 A.

\* cited by examiner

*Primary Examiner*—Minh-Loan T Tran
*Assistant Examiner*—W. Wendy Kuo
(74) *Attorney, Agent, or Firm*—Greenblum & Bernstein, P.L.C.

(57) ABSTRACT

To provide a semiconductor device that has a sufficiently low on-resistance and excellent low-capacitance and high-speed characteristics as compared with conventional GaN-based diodes. The semiconductor device includes: a substrate (101); a buffer layer (102); a stack structure (103 and 104) including at least one heterojunction unit (103 and 104) that is a stack of a layer (GaN layer 103) made of a nitride semiconductor and a layer (AlGaN layer 104) made of another nitride semiconductor having a larger band gap than the nitride semiconductor (GaN layer 103); a Schottky electrode (106) that is placed at a first end of the stack structure (103 and 104) and forms a Schottky barrier contact with the heterojunction unit (103 and 104); and an ohmic electrode (107) that is placed at a second end of the stack structure (103 and 104) and forms an ohmic contact with the heterojunction unit (103 and 104).

11 Claims, 6 Drawing Sheets

SEMICONDUCTOR DEVICE WITH SCHOTTKY AND OHMIC ELECTRODES IN CONTACT WITH A HETEROJUNCTION

BACKGROUND OF THE INVENTION (1) Field of the Invention

The present invention relates to a power semiconductor device suitable for an electric power application circuit which is represented by an inverter for use in an industrial power electronic appliance or a home electrical appliance.

(2) Description of the Related Art

In recent years, there have been strong demands for higher power, higher efficiency, and downsizing of electric power application circuits. An inverter, which is one of the representative electric power application circuits, is made up of a plurality of basic blocks in each of which a diode is connected in parallel with a collector and an emitter of a power transistor. This diode is used to let a reverse current escape when the transistor is turned OFF, and especially has a performance requirement of reducing a time of switching from ON to OFF. When the switching is not sufficiently fast, a problem of shorting between a high side and a low side of the inverter circuit arises. To prevent this, a Fast Recovery Diode (FRD) with excellent high-speed performance is typically used.

The FRD is required to have both high breakdown voltage characteristics in reverse bias and low on-resistance characteristics in forward bias. In general, there is a tradeoff relation between a breakdown voltage and an on-resistance of a diode, and a limit of the tradeoff is determined by physical properties of a semiconductor used for the semiconductor device. Diodes made of Si have conventionally been employed as such semiconductor devices, but in recent years the development of power semiconductor devices using wide-bandgap semiconductors such as SiC and GaN is ongoing to achieve higher performance.

In particular, an AlGaN/GaN heterostructure of nitride semiconductors has a high dielectric breakdown electric field and a high sheet carrier concentration when compared with conventionally-used silicon, and therefore can realize both high breakdown voltage characteristics and low on-resistance characteristics. For this reason, diodes with this structure have captured attention as high-power FRDs. Studies of diodes having AlGaN/GaN heterojunctions, which are intended for use as high-power semiconductor devices, have been reported from a number of organizations in Japan and abroad.

A high two-dimensional electron gas concentration of the order of $10^{13}$ ($cm^{-2}$) can be obtained by using an AlGaN/GaN heterostructure. To reduce the on-resistance even further, a diode having a plurality of heterojunctions has also been proposed (for example, see Japanese Unexamined Patent Application Publication No. 2006-108676).

The following describes a conventional diode made of nitride semiconductors, with reference to FIG. 1. In FIG. 1, a buffer layer 30, a GaN layer 39, an AlGaN layer 41, a GaN layer 38, and an AlGaN layer 40 are disposed on a substrate 28 in this order, and a Schottky electrode 20 and an ohmic electrode 22 are formed on the AlGaN layer 40 which is an outermost layer of an epitaxial structure. First two-dimensional electron gas is induced at an interface between the AlGaN layer 40 and the GaN layer 38, and second two-dimensional electron gas is induced at an interface between the AlGaN layer 41 and the GaN layer 39. A plurality of channels created by such two-dimensional electron gas serve to reduce the on-resistance.

However, since the Schottky electrode 20 has a junction with the AlGaN layer 40, when the diode is forward biased, a resistance between the Schottky electrode 20 and the first two-dimensional electron gas is relatively low, but an access resistance to the second two-dimensional electron gas increases due to a high heterobarrier. Consequently, the total on-resistance cannot be reduced as much as expected, despite the plurality of channels.

Moreover, since the Schottky electrode 20 has a junction with the AlGaN layer 40, a parallel-plate capacitor is created between the Schottky electrode 20 and the two-dimensional electron gas. This increases a capacitance of the diode. As a result, the diode cannot be switched between ON and OFF at high speed.

In view of the above problems, the present invention has an object of providing a semiconductor device that has a sufficiently low on-resistance and excellent low-capacitance and high-speed characteristics as compared with conventional GaN-based diodes.

SUMMARY OF THE INVENTION

To solve the conventional problems, simulations and experiments have been conducted for a structure that, even when there are a plurality of channels, can form a sufficiently-low-loss junction for each channel while minimizing the capacitance. Results of these simulations and experiments have revealed that, by employing a method of forming the Schottky barrier junction at end faces of the AlGaN layer and the GaN layer, even when there are a plurality of channels, the Schottky electrode can form a direct junction with each channel, and also the creation of a parallel-plate capacitor between the Schottky electrode and the two-dimensional electron gas can be prevented. The results have further revealed that the high breakdown voltage characteristics of GaN-based materials can be exhibited according to such a structure.

In detail, the semiconductor device according to the present invention is a semiconductor device including: a stack structure including one or more heterojunction units, each of the one or more heterojunction units being a stack of a layer made of a nitride semiconductor and a layer made of another nitride semiconductor having a larger band gap than the nitride semiconductor; a Schottky electrode that is placed at a first end of the stack structure and forms a Schottky barrier contact with the one or more heterojunction units; and an ohmic electrode that is placed at a second end of the stack structure and forms an ohmic contact with the one or more heterojunction units. Here, a first recess may be formed at the first end, the first recess extending from a top surface of the stack structure to a lowermost nitride semiconductor layer in the stack structure, wherein a second recess is formed at the second end, the second recess extending from the top surface of the stack structure to the lowermost nitride semiconductor layer in the stack structure, the Schottky electrode is in contact with a side wall of the first recess, and the ohmic electrode is in contact with a side wall of the second recess.

Thus, by forming the recess that extends to the nitride semiconductor layer farthest from the top surface of the stack structure and placing the Schottky electrode in the recess, the Schottky barrier junction can be formed at the end face of the heterojunction. In this way, a low-resistance junction can be obtained. Moreover, a parallel-plate capacitor is not created between the Schottky electrode and two-dimensional electron gas, which contributes to a reduction in capacitance. As a result, a semiconductor device which is extremely low loss and capable of a high-speed operation, that is, a Schottky barrier diode, can be realized.

Here, the stack structure may include a plurality of heterojunction units, wherein the Schottky electrode forms a Schottky barrier contact with the plurality of heterojunction units, and the ohmic electrode forms an ohmic contact with the plurality of heterojunction units. As one example, the stack structure may include, as the plurality of heterojunction units, a first layer made of a first nitride semiconductor, a second layer made of a second nitride semiconductor having a larger band gap than the first nitride semiconductor, a third layer made of a third nitride semiconductor having a smaller band gap than the second nitride semiconductor, and a fourth layer made of a fourth nitride semiconductor having a larger band gap than the third nitride semiconductor, in the stated order from lowermost to uppermost.

According to this structure, a diode having a plurality of channels can be realized, with it being possible to further reduce an on-resistance in forward bias.

Here, a thickness of the fourth layer may be more than 20 nm and less than 60 nm.

According to this structure, highly-concentrated two-dimensional electron gas is induced in a first channel (a channel closer to the top surface of the stack structure). As a result, a semiconductor device which is extremely low loss can be realized.

Here, a thickness of the second layer may be more than 20 nm and less than 60 nm.

According to this structure, highly-concentrated two-dimensional electron gas is induced in a second channel (a channel farther from the top surface of the stack structure), too. As a result, a semiconductor device with lower loss can be realized.

Here, a mixed crystal ratio (for example, Al component ratio) of the second nitride semiconductor and the fourth nitride semiconductor may be in a range of 0.2 to 0.5 inclusive.

According to this structure, a polarization charge density increases, which causes highly-concentrated two-dimensional electron gas to be induced in the first channel and the second channel. As a result, a semiconductor device which is extremely low loss can be realized.

Here, a minimum distance between the Schottky electrode and the ohmic electrode may be constant, wherein one of the Schottky electrode and the ohmic electrode is surrounded by an other one of the Schottky electrode and the ohmic electrode.

According to this structure, it is possible to completely eliminate a region where an electric field concentrates between the Schottky electrode and the ohmic electrode. As a result, a semiconductor device with an extremely high breakdown voltage can be realized.

Here, the semiconductor device may further include a substrate that supports the stack structure, wherein the substrate has a through hole directly underneath the one of the Schottky electrode and the ohmic electrode surrounded by the other one of the Schottky electrode and the ohmic electrode, and the one of the Schottky electrode and the ohmic electrode surrounded by the other one of the Schottky electrode and the ohmic electrode is electrically connected to a back of the substrate via the through hole.

According to this structure, one of the electrodes can be connected to a die pad. This makes it possible to not only let a current flow but also dissipate heat generated in the device from the back of the substrate, via a conductor on a side wall of the through hole. Thus, a parasitic inductance component and a thermal resistance of the device can be reduced. As a result, a semiconductor device with excellent heat dissipation characteristics can be realized.

As described above, according to the present invention, it is possible to reduce a resistance component between the Schottky electrode and the two-dimensional electron gas induced in the heterojunction of the nitride semiconductor layers such as AlGaN/GaN, and also reduce a capacitance component. This provides extremely low resistance and low capacitance characteristics. Hence a semiconductor device which is low loss and capable of a high-speed operation can be realized.

Therefore, the present invention has a very high practical value as a Schottky barrier diode used for an electric power application circuit.

FURTHER INFORMATION ABOUT TECHNICAL BACKGROUND TO THIS APPLICATION

The disclosure of Japanese Patent Application No. 2007-286613 filed on Nov. 2, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

The following describes embodiments of the present invention with reference to drawings.

First Embodiment

Figure 1:
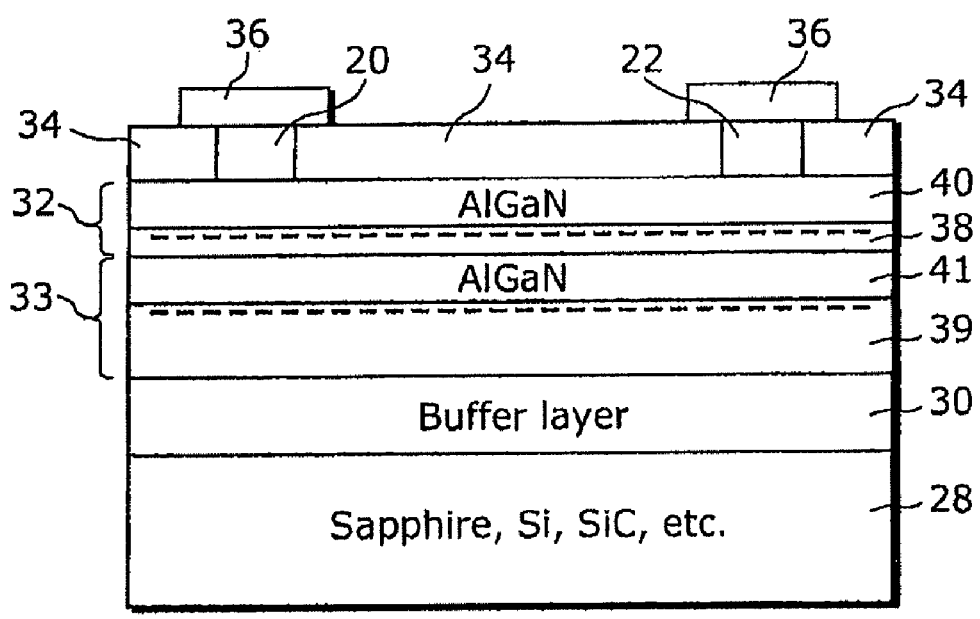
FIG. 1 is a sectional view of a conventional semiconductor device.
Figure 2:
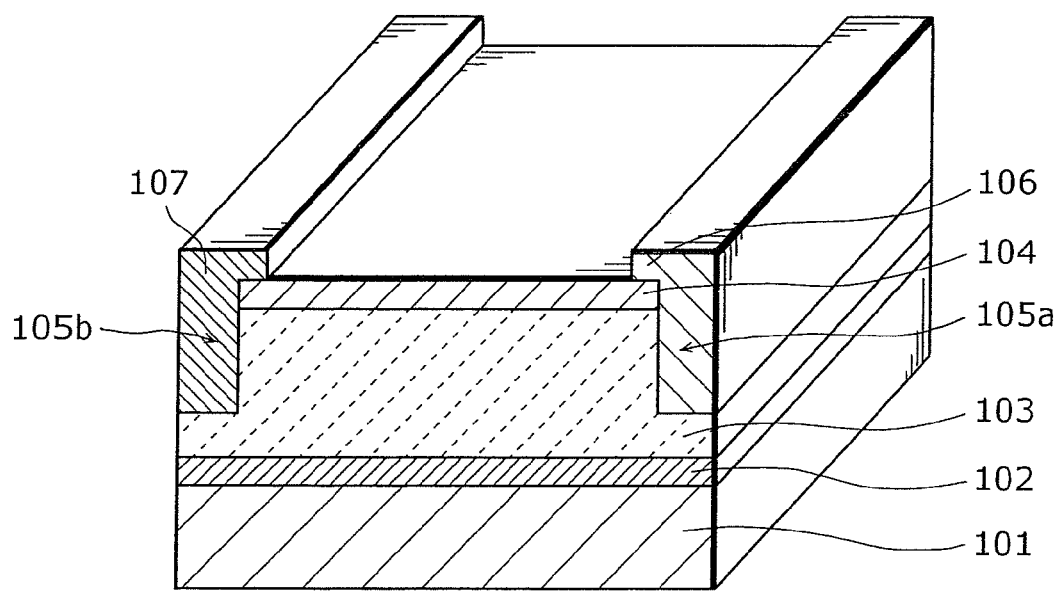
FIG. 2 is a sectional view of a semiconductor device in a first embodiment of the present invention.

FIG. 2 shows a semiconductor device in a first embodiment of the present invention. This semiconductor device is a Schottky barrier diode, and includes: a substrate 101; a buffer layer 102; a stack structure (103 and 104) including at least one heterojunction unit (103 and 104) that is a stack of a layer (GaN layer 103) made of a nitride semiconductor and a layer (AlGaN layer 104) made of another nitride semiconductor having a larger band gap than the nitride semiconductor (GaN layer 103); a Schottky electrode 106 that is placed at a first end of the stack structure (103 and 104) and forms a Schottky barrier contact with the heterojunction unit (103 and 104);

and an ohmic electrode 107 that is placed at a second end of the stack structure (103 and 104) and forms an ohmic contact with the heterojunction unit (103 and 104). A first recess 105*a* that extends from a top surface of the stack structure (103 and 104) to a lowermost nitride semiconductor layer (GaN layer 103) in the stack structure (103 and 104) is formed at the first end. A second recess 105*b* that extends from the top surface of the stack structure (103 and 104) to the lowermost nitride semiconductor layer (GaN layer 103) in the stack structure (103 and 104) is formed at the second end. The Schottky electrode 106 is in contact with a side wall of the first recess 105*a*, and the ohmic electrode 107 is in contact with a side wall of the second recess 105*b*.

Thus, by forming the recess 105*a* that extends from the top surface to the nitride semiconductor of the lowermost layer (GaN layer 103) and providing the Schottky electrode 106 in the recess 105*a*, a Schottky barrier junction can be formed at an end face of the heterojunction. In this way, a low-resistance junction can be obtained. Moreover, with the provision of the recess 105*a*, the induction of two-dimensional electron gas in that region can be suppressed. This contributes to a significant reduction in area of a parallel-plate capacitor between the Schottky electrode 106 and the two-dimensional electron gas. Hence a reduction in capacitance of the diode can be achieved.

Figure 3:
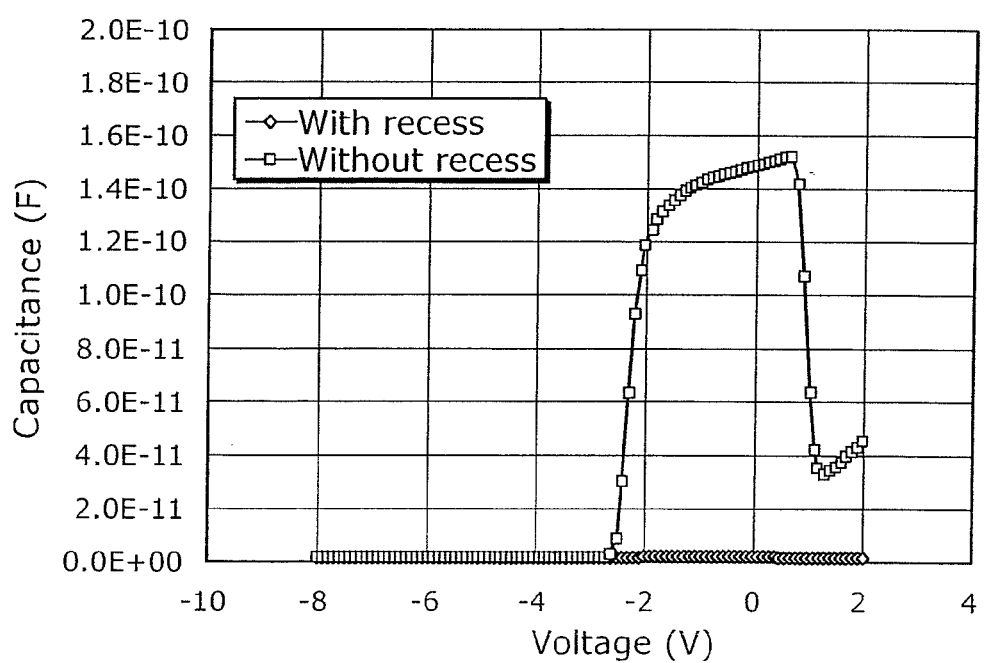
FIG. 3 shows capacitance reduction effects of a recess structure in the semiconductor device according to the present invention.

FIG. 3 shows experimental results on bias voltage dependence of the capacitance of the diode. In FIG. 3, a horizontal axis represents a bias voltage applied to the diode (a voltage applied to the Schottky electrode 106 with reference to the ohmic electrode 107), and a vertical axis represents a capacitance between the two electrodes measured for each bias voltage. Note that FIG. 3 shows experimental results for both a diode having a recess (recess structure) as in this embodiment and a conventional diode without the recess structure. As can be understood from FIG. 3, the recess structure is extremely effective for capacitance reduction. As a result, a semiconductor device that operates at an extremely high speed can be realized.

In addition, by providing the recess structure for the ohmic electrode 107 too as shown in FIG. 2, an ohmic resistance can be reduced.

The substrate 101 can be made of any of various substrate materials such as sapphire, silicon, SiC, and GaN. The buffer layer 102 on the substrate 101 is preferably made of AlN. This allows for a reduction in crystal dislocation density, with it being possible to realize excellent device characteristics.

The recess structure (recesses 105*a* and 105*b*) can be formed by photolithography and etching. The Schottky electrode 106 can be formed by depositing a Schottky metal (such as Ni/Au, Pt/Au, Pd/Au, Au, or TiW) in the first recess 105*a*, whereas the ohmic electrode 107 can be formed by depositing an ohmic metal (such as Ti/Al) in the second recess 105*b* and then performing annealing.

Second Embodiment

Figure 4:
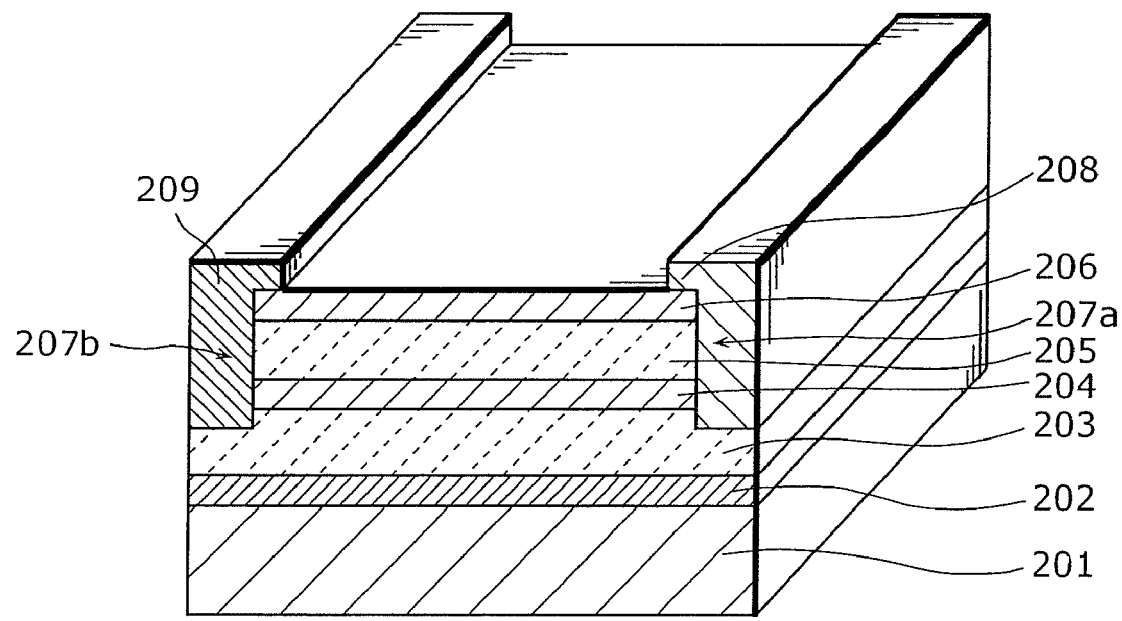
FIG. 4 is a sectional view of a semiconductor device in a second embodiment of the present invention.

FIG. 4 shows a semiconductor device in a second embodiment of the present invention. This semiconductor device is a Schottky barrier diode, and includes: a substrate 201; a buffer layer 202; a stack structure (203 to 206) including two heterojunction units (203 and 204, and 205 and 206) each of which is a stack of a layer (GaN layer 203, GaN layer 205) made of a nitride semiconductor and a layer (AlGaN layer 204, AlGaN layer 206) made of another nitride semiconductor having a larger band gap than the nitride semiconductor (GaN layer 203, GaN layer 205); a Schottky electrode 208 that is placed at a first end of the stack structure (203 to 206) and forms a Schottky barrier contact with the heterojunction units (203 to 206); and an ohmic electrode 209 that is placed at a second end of the stack structure (203 to 206) and forms an ohmic contact with the heterojunction units (203 to 206). A first recess 207*a* that extends from a top surface of the stack structure (203 to 206) to a lowermost nitride semiconductor layer (GaN layer 203) in the stack structure (203 to 206) is formed at the first end. A second recess 207*b* that extends from the top surface of the stack structure (203 to 206) to the lowermost nitride semiconductor layer (GaN layer 203) in the stack structure (203 to 206) is formed at the second end. The Schottky electrode 208 is in contact with a side wall of the first recess 207*a*, and the ohmic electrode 209 is in contact with a side wall of the second recess 207*b*.

In other words, the stack structure (203 to 206) in this embodiment includes, as a plurality of heterojunction units, a first layer (GaN layer 203) made of a first nitride semiconductor, a second layer (AlGaN layer 204) made of a second nitride semiconductor having a larger band gap than the first nitride semiconductor, a third layer (GaN layer 205) made of a third nitride semiconductor having a smaller band gap than the second nitride semiconductor, and a fourth layer (AlGaN layer 206) made of a fourth nitride semiconductor having a larger band gap than the third nitride semiconductor, in this order from lowermost to uppermost.

According to this structure, even when there are a plurality of heterojunctions, a Schottky barrier junction can be formed on an end face of each heterojunction. In this way, a junction with an extremely low resistance can be obtained. Moreover, with the provision of the recess, the induction of two-dimensional electron gas in that region can be suppressed. This contributes to a significant reduction in area of a parallel-plate capacitor between the Schottky electrode 208 and the two-dimensional electron gas. Hence a reduction in capacitance of the diode can be achieved. As a result, a semiconductor device that is extremely low loss and capable of a high-speed operation can be realized.

This embodiment describes the case where the number of channels (i.e., the number of heterojunction units) is two, but a low-loss semiconductor device can equally be realized when the number of channels is three or more.

Note that two types of semiconductors (GaN layer 203 and AlGaN layer 204) forming a first heterojunction and two types of semiconductors (GaN layer 205 and AlGaN layer 206) forming a second heterojunction need not be the same, so long as the two types of semiconductors have different band gaps. For example, a structure such as GaN/ $Al_{0.2}Ga_{0.8}N/GaN/Al_{0.3}Ga_{0.7}N$ from lowermost to uppermost is applicable.

Figure 5A:
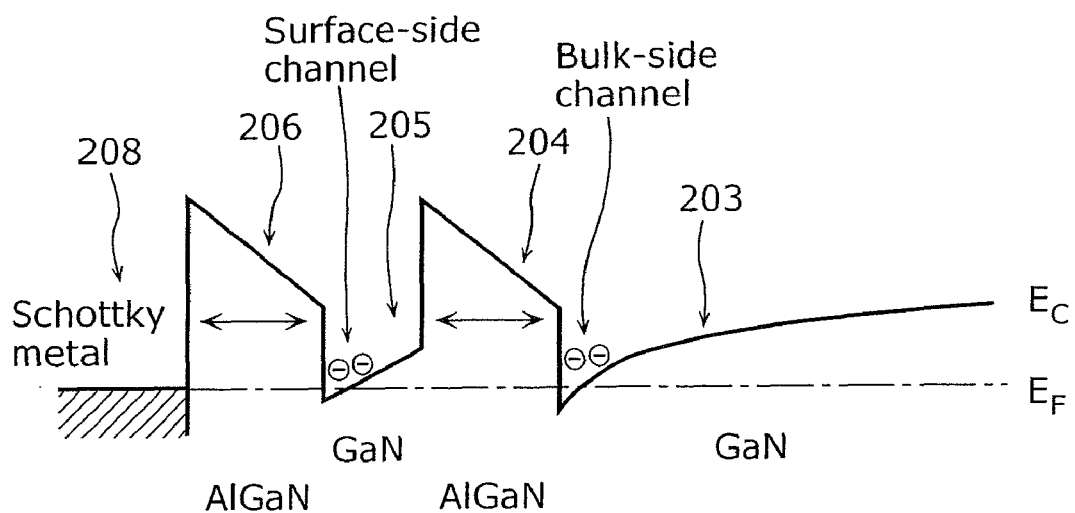
FIG. 5 shows dependence of an electron concentration on a device structure (surface-side AlGaN thickness) in the semiconductor device according to the present invention.
Figure 5B:
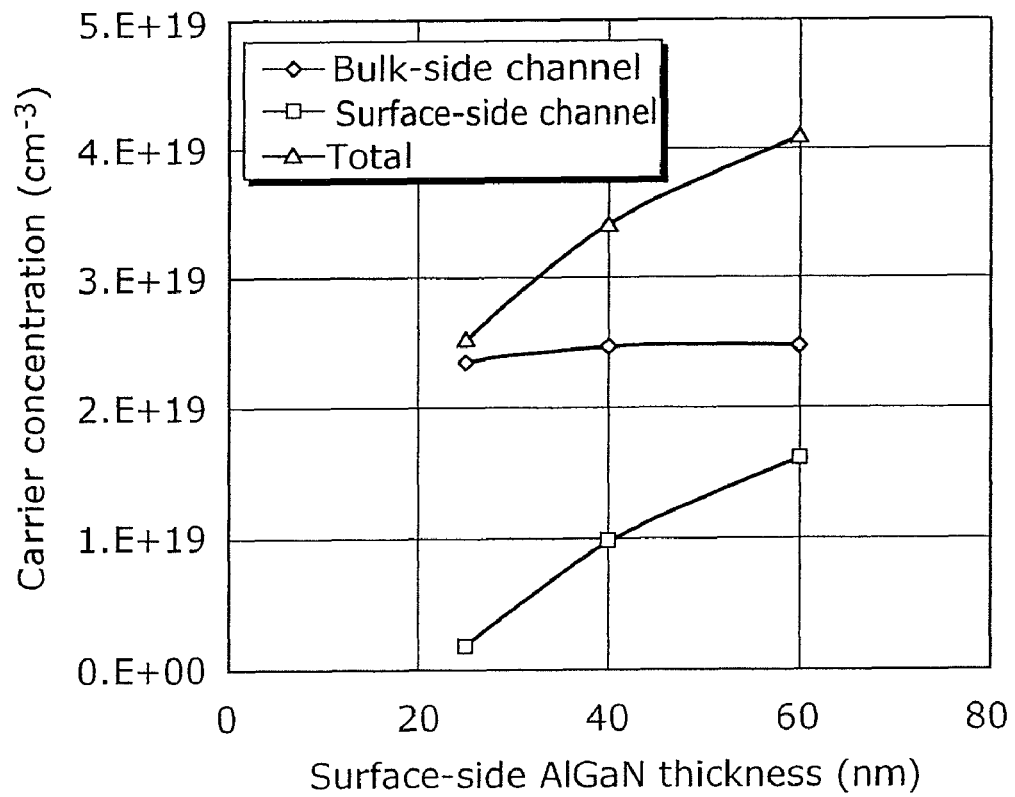

Moreover, a thickness of the second AlGaN layer 206 is preferably more than 20 nm and less than 60 nm. This is because, with this range of thickness, a high two-dimensional electron gas concentration can be obtained in the second heterojunction. Usually, it is extremely difficult to predict a concentration of two-dimensional electron gas in a plurality of channels. However, the inventors have calculated this concentration by simultaneously solving the Poisson equation and the Schrödinger equation. Results of this are shown in FIG. 5. FIG. 5A shows an energy structure of a cross section that crosses the Schottky electrode 208 and the stack structure (203 to 206) in the diode of this embodiment, and FIG. 5B shows the carrier concentration (vertical axis) against the thickness of the surface-side AlGaN layer 206 (horizontal axis). Note that FIG. 5B shows three curves, namely, "bulk-side channel" (carrier concentration in the first heterojunction composed of the GaN layer 203 and the AlGaN layer 204), "surface-side channel" (carrier concentration in the second heterojunction composed of the GaN layer 205 and the AlGaN layer 206), and "total" (total carrier concentration in the first and second heterojunctions).

As can be seen from the "surface-side channel" and "total" curves in FIG. 5B, when the film thickness of the AlGaN layer 206 is small (equal to or less than 20 nm), almost no two-dimensional electron gas is induced. On the other hand, when the film thickness of the AlGaN layer 206 is more than 20 nm, the electron concentration can be increased significantly. When the film thickness of the AlGaN layer 206 is equal to or more than 60 nm, however, no polarization charge occurs in reality due to crystal lattice relaxation, and also a problem of crack generation arises.

Figure 6:
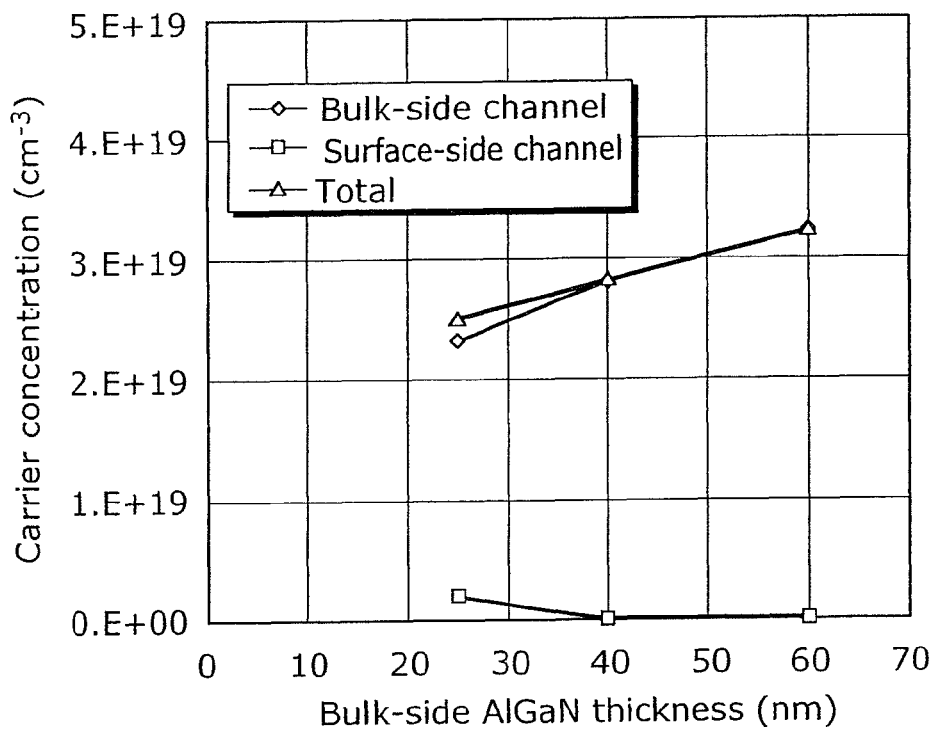
FIG. 6 shows dependence of an electron concentration on a device structure (bulk-side AlGaN thickness) in the semiconductor device according to the present invention.

FIG. 6 shows the carrier concentration (vertical axis) against the thickness of the bulk-side AlGaN layer 204 (horizontal axis). FIG. 6 shows three curves, namely, "bulk-side channel", "surface-side channel", and "total", in the same manner as in FIG. 5B. As can be seen from the "bulk-side channel" and "total" curves in FIG. 6, a thickness of the first AlGaN layer 204 is preferably more than 20 nm and less than 60 nm, too. With this range of thickness, a high two-dimensional electron gas concentration can be obtained in the first heterojunction. This is demonstrated as a result of the aforementioned simulations. Which is to say, when the film thickness of the AlGaN layer 204 is more than 20 nm, the electron concentration can be increased significantly. When the film thickness of the AlGaN layer 204 is equal to or more than 60 nm, however, no polarization charge occurs in reality due to crystal lattice relaxation, and also a problem of crack generation arises.

Figure 7:
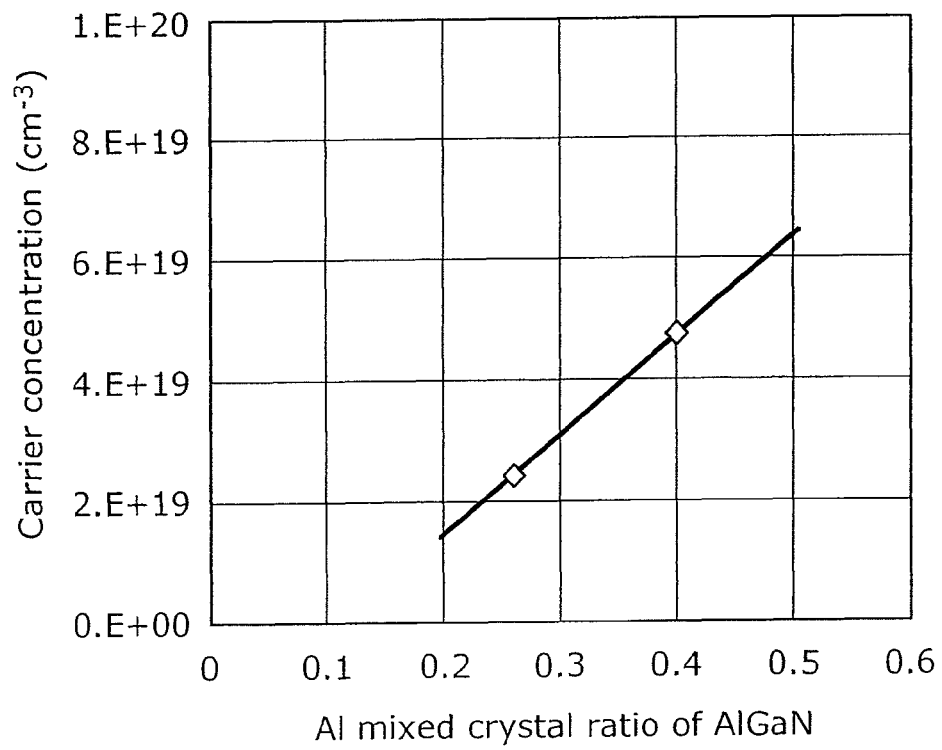
FIG. 7 shows dependence of an electron concentration on a device structure (Al mixed crystal ratio of AlGaN) in the semiconductor device according to the present invention.

FIG. 7 shows the carrier concentration against the mixed crystal ratio of the AlGaN layer (Al component ratio by weight). As shown in FIG. 7, the mixed crystal ratio of the first AlGaN layer 204 and the second AlGaN layer 206 is preferably in a range of 0.2 to 0.5. With this range of mixed crystal ratio, a high two-dimensional electron gas concentration can be obtained in the two heterojunctions. This is demonstrated as a result of the aforementioned simulations.

Third Embodiment

Figure 8A:
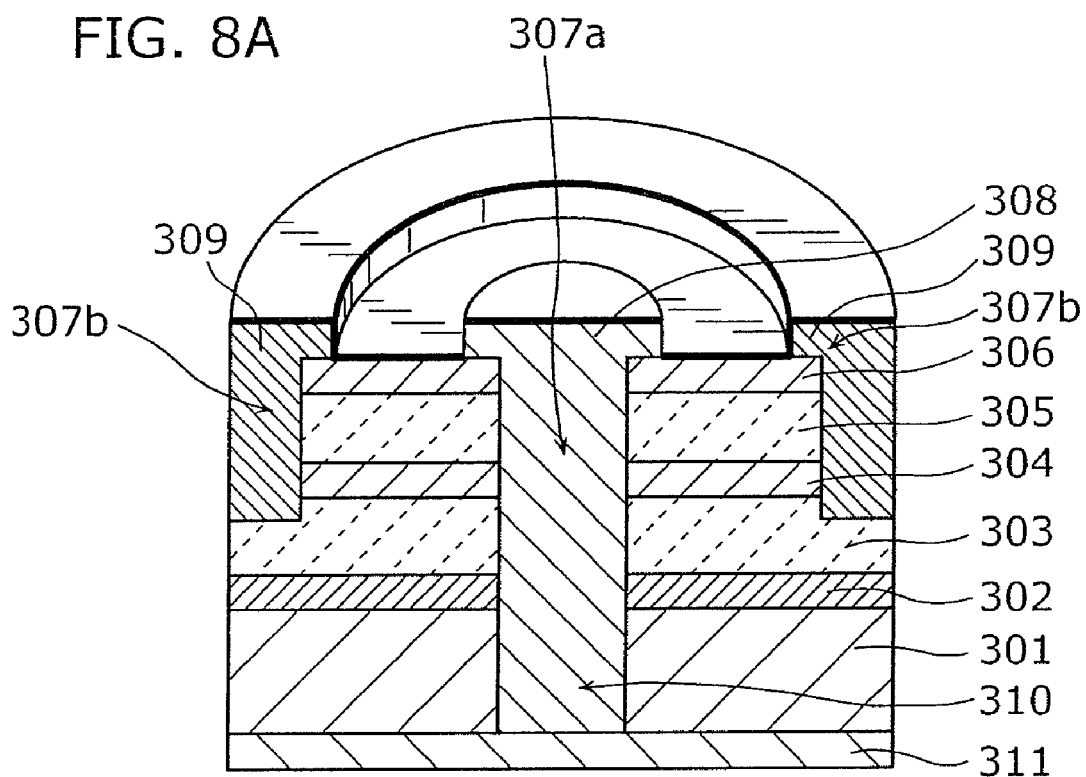
FIG. 8 is a sectional view of a semiconductor device in a third embodiment of the present invention.
Figure 8B:
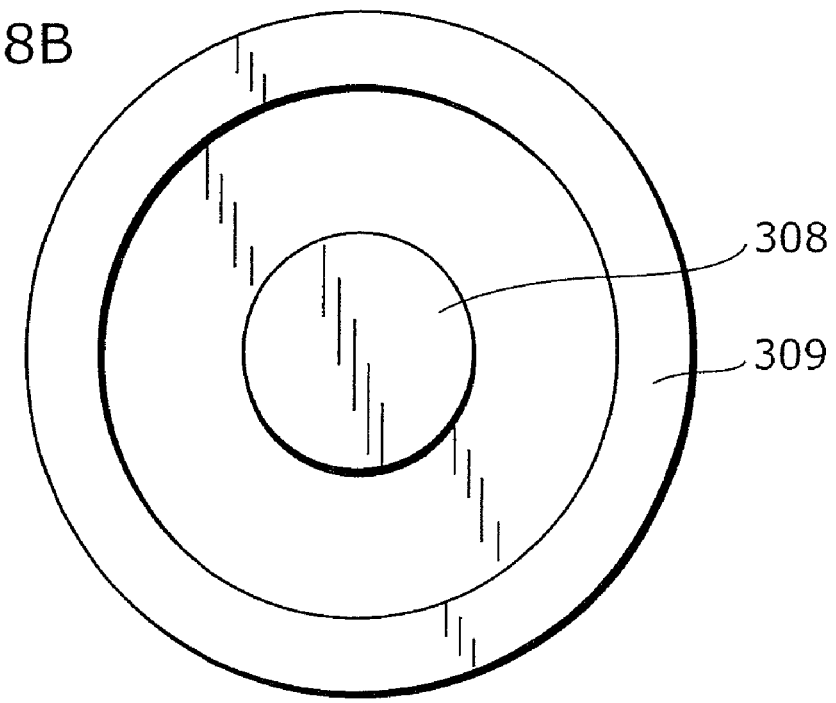

FIGS. 8A and 8B show a semiconductor device in a third embodiment of the present invention. This semiconductor device is a cylindrical Schottky barrier diode, and includes: a back electrode 311; a substrate 301; a buffer layer 302; a stack structure (303 to 306) including two heterojunction units (303 and 304, and 305 and 306) each of which is a stack of a layer (GaN layer 303, GaN layer 305) made of a nitride semiconductor and a layer (AlGaN layer 304, AlGaN layer 306) made of another nitride semiconductor having a larger band gap than the nitride semiconductor (GaN layer 303, GaN layer 305); a Schottky electrode 308 that is placed at a first end (inside hollow portion of the cylinder in FIG. 8A) of the stack structure (303 to 306) and forms a Schottky barrier contact with the heterojunction units (303 to 306); and an ohmic electrode 309 that is placed at a second end (outside face of the cylinder in FIG. 8A) of the stack structure (303 to 306) and forms an ohmic contact with the heterojunction units (303 to 306). A first recess 307a (inside hollow portion of the cylinder in FIG. 8A) that extends from a top surface of the stack structure (303 to 306) to a lowermost nitride semiconductor layer (GaN layer 303) in the stack structure (303 to 306) is formed at the first end. A second recess 307b that extends from the top surface of the stack structure (303 to 306) to the lowermost nitride semiconductor layer (GaN layer 303) in the stack structure (303 to 306) is formed at the second end. The Schottky electrode 308 is in contact with a side wall of the first recess 307a (the Schottky electrode 308 is filled in the inside hollow portion in FIG. 8A), and the ohmic electrode 309 is in contact with a side wall of the second recess 307b.

Here, the Schottky electrode 308 and the ohmic electrode 309 are arranged so that a minimum distance between the Schottky electrode 308 and the ohmic electrode 309 is constant and also that the ohmic electrode 309 surrounds the Schottky electrode 308. In addition, the substrate 301 and the buffer layer 302 have a through hole 310 directly underneath the Schottky electrode 308, and the Schottky electrode 308 is electrically connected to the back electrode 311 via the through hole 310.

According to this structure, it is possible to prevent an electric field from concentrating in the regions of the Schottky electrode 308 and the ohmic electrode 309. Furthermore, heat can be dissipated from the back of the substrate via the through hole 310. As a result, a semiconductor device that is extremely low loss and capable of a high-speed operation and also has a high breakdown voltage and excellent heat dissipation performance can be realized.

This embodiment describes the case where the Schottky electrode 308 is placed inside and the ohmic electrode 309 is placed outside, but a semiconductor device that is extremely low loss and capable of a high-speed operation and also has a high breakdown voltage and excellent heat dissipation performance can equally be realized even when the Schottky electrode 308 is placed outside and the ohmic electrode 309 is placed inside.

Although the semiconductor device according to the present invention has been described by way of the first to third embodiments, the present invention is not limited to these embodiments. Various changes that can be conceived by a person skilled in the art may be made to these embodiments, and other forms may be realized by arbitrarily combining components of these embodiments, without departing from the scope of the present invention.

For example, the cylindrical structure shown in the third embodiment is applicable not only to a semiconductor device having two channels, but also to a semiconductor device having one channel as shown in FIG. 2 or a semiconductor device having three or more channels.

Furthermore, the characteristics shown in FIGS. 3 and 5 to 7 are not limited to the corresponding embodiments, as similar characteristics can also be attained in a semiconductor device having a different number of channels in any other embodiment.

The semiconductor device according to the present invention is useful as a Schottky barrier diode used for a high-power high-frequency device or a high-power switching device in a power semiconductor device of an electric power application circuit.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A semiconductor device comprising:
a plurality of heterojunctions, said plurality of heterojunctions including a first nitride semiconductor layer, a second nitride semiconductor layer having a bandgap larger than a bandgap of said first nitride semiconductor layer, a third nitride semiconductor layer having a bandgap smaller than the bandgap of said second nitride semiconductor layer, and a fourth nitride semiconductor layer having a bandgap larger than the bandgap of said third nitride semiconductor layer, said first nitride semiconductor layer being at a lowermost position, said second nitride semiconductor layer being on top of said first nitride semiconductor, said third nitride semiconductor layer being on top of said second nitride semiconductor layer, and said fourth nitride semiconductor layer being on top of said third nitride semiconductor layer at a topmost position, a Schottky electrode that is located at a first portion of each of said plurality of heterojunctions to form a Schottky barrier contact with said plurality of heterojunctions; and an ohmic electrode that is located at a second portion of each of said plurality of heterojunctions to form an ohmic contact with said plurality of heterojunctions, wherein a first recess is located at the first portion, the first recess extending from a top surface of said plurality of heterojunctions to said first nitride semiconductor layer, a second recess is located at the second portion, the second recess extending from the top surface of said plurality of heterojunctions to said first nitride semiconductor layer, said Schottky electrode directly contacts a side wall of the first recess, and said ohmic electrode directly contacts a side wall of the second recess.

2. The semiconductor device according to claim 1,
wherein said fourth nitride semiconductor layer is thicker than said second nitride semiconductor layer.

3. The semiconductor device according to claim 2,
wherein a thickness of said fourth nitride semiconductor layer is greater than 20 nm and less than 60 nm.

4. The semiconductor device according to claim 3,
wherein a thickness of said second nitride semiconductor layer is greater than 20 nm and less than 60 nm.

5. A semiconductor device, comprising:
a stack structure including at least one heterojunction, said at least one heterojunction being a stack including a first nitride semiconductor layer and a second nitride semiconductor layer, said second nitride semiconductor layer having a bandgap larger than a bandgap of said first nitride semiconductor layer, a third nitride semiconductor layer having a smaller bandgap than the bandgap of said second nitride semiconductor layer, and a fourth nitride semiconductor layer having a bandgap larger than the bandgap of said third nitride semiconductor, said first nitride semiconductor layer being at a lowermost position, said second nitride semiconductor layer being on top of said first nitride semiconductor, said third nitride semiconductor layer being on top of said second nitride semiconductor layer, and said fourth nitride semiconductor layer being on top of said third nitride semiconductor layer at a topmost position;

a Schottky electrode located at a first portion of said stack structure and that forms a Schottky barrier contact with said at least one heterojunction;

an ohmic electrode located at a second portion of said stack structure and that forms an ohmic contact with said at least one heterojunction, wherein a first recess is located at the first portion of said stack structure, the first recess extending from a top surface of said stack structure to said first nitride semiconductor layer in said stack structure;

a second recess located the second portion of said stack structure, the second recess extending from the top surface of said stack structure to said first nitride semiconductor layer in said stack structure;

said Schottky electrode is in contact with a side wall of the first recess; and said ohmic electrode is in contact with a side wall of the second recess, wherein Al mixed crystal ratios of the second nitride semiconductor layer and the fourth nitride semiconductor layer are in a range of 0.2 to 0.5 inclusively.

6. The semiconductor device according to claim 1,
wherein a minimum distance between said Schottky electrode and said ohmic electrode is constant, and
one of said Schottky electrode and said ohmic electrode is surrounded by the other one of said Schottky electrode and said ohmic electrode.

7. The semiconductor device according to claim 6, further comprising:
a substrate that supports said plurality of heterojunctions,
wherein said substrate has a through hole directly underneath said one of said Schottky electrode and said ohmic electrode and is surrounded by the other one of said Schottky electrode and said ohmic electrode, and
said one of said Schottky electrode and said ohmic electrode surrounded by the other one of said Schottky electrode and said ohmic electrode is electrically connected to a back of said substrate via the through hole.

8. A semiconductor device, comprising:
a stack structure including at least one heterojunction, each said at least one heterojunction being a stack of a first nitride semiconductor layer and a second nitride semiconductor layer, said second nitride semiconductor layer having a bandgap larger than a bandgap of said first nitride semiconductor layer;

a Schottky electrode at a first portion of said stack structure and forms a Schottky barrier contact with said at least one heterojunction;

a substrate that supports said stack structure; and an ohmic electrode at a second portion of said stack structure and forms an ohmic contact with said at least one heterojunction, wherein a first recess is provided at the first portion, the first recess extending from a top surface of said stack structure to said first nitride semiconductor layer at a lowermost position in said stack structure;

a second recess is provided at the second portion, the second recess extending from the top surface of said stack structure to said first nitride semiconductor layer at the lowermost position in said stack structure, said Schottky electrode is in contact with a side wall of the first recess; and said ohmic electrode is in contact with a side wall of the second recess, wherein a minimum distance between said Schottky electrode and said ohmic electrode is constant; and one of said Schottky electrode and said ohmic electrode is surrounded by the other one of said Schottky electrode and said ohmic electrode and is electrically connected to a back of said substrate via a through hole;

wherein said at least one heterojunction and said substrate form a cylinder with one common inside hollow portion;

the first recess is in the inside hollow portion; and the second recess is on an outside surface of the cylinder.

9. The semiconductor device according to claim 1,
wherein the first recess and the second recess penetrate said second nitride semiconductor layer, said third nitride semiconductor layer and said fourth nitride semiconductor layer, and do not penetrate said first semiconductor layer.

10. The semiconductor device according to claim 9, wherein said Schottky electrode and said ohmic electrode are in direct contact with a first interface between said first nitride semiconductor layer and said second nitride semiconductor layer, and a second interface between said third nitride semiconductor layer and said fourth nitride semiconductor layer.

11. The semiconductor device according to claim 1, wherein Al mixed crystal ratios of said second nitride semiconductor layer and said fourth nitride semiconductor layer are in a range of 0.2 to 0.5 inclusively.

* * * * *